(12) United States Patent
Robert

(10) Patent No.: US 7,648,859 B2
(45) Date of Patent: Jan. 19, 2010

(54) MICROCOMPONENT COMPRISING A HERMETICALLY-SEALED MICROCAVITY AND METHOD FOR PRODUCTION OF SUCH A MICROCOMPONENT

(75) Inventor: Philippe Robert, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 415 days.

(21) Appl. No.: 10/582,343

(22) PCT Filed: Dec. 14, 2004

(86) PCT No.: PCT/FR2004/003216
§ 371 (c)(1),
(2), (4) Date: Jun. 9, 2006

(87) PCT Pub. No.: WO2005/061374
PCT Pub. Date: Jul. 7, 2005

(65) Prior Publication Data
US 2008/0041607 A1    Feb. 21, 2008

(30) Foreign Application Priority Data
Dec. 19, 2003 (FR) .................................. 03 15029

(51) Int. Cl.
*H01L 21/00* (2006.01)
*H01L 21/311* (2006.01)
*H01L 23/04* (2006.01)

(52) U.S. Cl. .................. 438/127; 438/48; 438/700; 438/702; 257/414; 257/730; 257/E23.193

(58) Field of Classification Search .................. 438/51, 438/48, 127, 700, 702; 257/414, 730, E23.193
See application file for complete search history.

(56) References Cited

U.S. PATENT DOCUMENTS
5,090,254 A    2/1992 Guckel et al.
6,667,189 B1 * 12/2003 Wang et al. .................. 438/53
2003/0217915 A1 * 11/2003 Ouellet et al. .......... 204/192.15

FOREIGN PATENT DOCUMENTS
DE    100 05 555 A    8/2001
EP    0 451 992 A    10/1991

OTHER PUBLICATIONS

M. Bartek et al., "Vacuum sealing of microcavities using metal evaporation," *Sensors and Actuators A*, vol. 60, No. 1-3, pp. 364-368 (May 1, 1997).
M. Furtsch et al., "Texture and stress profile in thick polysilicon films suitable for fabrication of microstructures," *Thin Solid Films*, vol. 296, No. 1-2, pp. 177-180 (Mar. 1, 1997).

* cited by examiner

*Primary Examiner*—Hsien-ming Lee
*Assistant Examiner*—Kevin Parendo
(74) *Attorney, Agent, or Firm*—Oliff & Berridge, PLC

(57) ABSTRACT

The microcavity is delineated by a cover, comprising a first layer, in which at least one hole is formed. A second layer hermetically seals the microcavity. A third layer is arranged between the first and the second layer. An additional microcavity, communicating with the hole, is arranged between the first and the third layer. At least one additional hole, adjacent to the additional microcavity, formed in the third layer and offset with respect to the hole, is sealed by the second layer, after sacrificial layers have been removed through the additional hole. The microcomponent includes at least one mechanically stressed layer arranged above the first layer.

9 Claims, 4 Drawing Sheets

MICROCOMPONENT COMPRISING A HERMETICALLY-SEALED MICROCAVITY AND METHOD FOR PRODUCTION OF SUCH A MICROCOMPONENT

BACKGROUND OF THE INVENTION

The invention relates to a microcomponent comprising a hermetically-sealed microcavity delineated by a cover comprising a first layer, in which at least one hole is formed, and a second layer making the microcavity hermetic, microcomponent comprising a third layer arranged between the first and second layer, an additional microcavity, communicating with the hole and arranged between the first and third layer, and at least one additional hole, adjacent to the additional microcavity, formed in the third layer, offset with respect to the hole and sealed by the second layer.

STATE OF THE ART

Hermetic encapsulation of electromechanical microsystems is necessary for several reasons. Dust and humidity can, in particular, disturb operation of the moving parts and the electric contacts can be impaired by the oxygen of the ambient air.

Conventionally, electromechanical microsystems are enclosed in a hermetically-sealed microcavity delineated by a cover. A known method for production of a hermetic cover is represented in FIGS. 1 and 2. The electromechanical microsystems 1 are generally arranged on a substrate 2. As represented in FIG. 1, the cover is formed, on the substrate 2 and on a sacrificial layer 3 formed on the substrate 2, by a first layer 4 in which a hole 5, or possibly several holes 5, is or are formed. Then the sacrificial layer 3 is removed via the hole 5 so as to obtain a microcavity 6, as represented in FIG. 2. Then a second layer 7, or sealing layer, is deposited on the first layer 4 so as to make the microcavity 6 hermetic.

Fabrication by means of a sacrificial layer 3 gives rise to problems, the two major ones being an insufficient tightness of sealing and a lengthy time required for the removal step of the sacrificial layer 3, in particular in the case of large covers.

To achieve hermetic sealing of the cover, the holes 5 are in fact typically small and localized in zones of the sacrificial layer 3, and consequently of the microcavity 6, that present a small thickness, as represented in FIG. 1. Typically, the thickness of the sacrificial layer 3 at the location of the hole 5, in a peripheral zone of the microcavity 6, is about 0.5 microns, whereas the thickness of the sacrificial layer 3 covering the electromechanical microsystems 1 is about 10 microns. The etching step of the sacrificial layer 3 is then long and difficult. This drawback is all the more pronounced the smaller the thickness of the sacrificial layer 3 at the location of the hole 5, to achieve the best possible sealing, which thickness is sometimes less than 0.2 microns.

The document DE10005555 describes a microcomponent comprising a hermetic cavity delineated by a cover. The cover comprises bottom and top layers respectively having holes offset with respect to one another and arranged at the top part of the cover. During the microcomponent fabrication process, the bottom and top layers are deposited on first and second sacrificial layers. Removal of the sacrificial layers is performed through the holes of the top layer. The first sacrificial layer is moreover removed through the holes of the bottom layer. The top layer forms bridges extending above the holes of the bottom layer and arranged between two holes of the top layer. The holes of the top and bottom layers communicate respectively with one another by means of additional cavities arranged between the bottom layer and the top layer. During the fabrication process, the additional cavities are achieved by means of the second sacrificial layer. At the end of the process, the holes of the top layer are sealed by a closing layer deposited on the top layer and forming seals in the holes. The bottom layer can be achieved under an intrinsic tensile mechanical stress.

The article "Vacuum sealing of microcavities using metal evaporation" by M. Bartek et al. (Sensors and Actuators A 61 (1997) 364-368) describes a method for producing a microcomponent. A sacrificial layer is deposited in a cavity of a substrate and partially covered by a layer of silicon nitride so as to leave a hole opening out onto the sacrificial layer. The silicon nitride layer is subjected to a weak mechanical stress. Then a second sacrificial layer is deposited in the hole and at the periphery of the hole. The second sacrificial layer is then partially covered by a polysilicon layer. The sacrificial layers are removed and the cavities obtained are closed by deposition of a sealing layer made of aluminium or polysilicon. A microcomponent is obtained comprising a hermetically-sealed microcavity covered by a cover. The cover is successively formed by the silicon nitride layer, the polysilicon layer and the sealing layer. Between the silicon nitride layer and the polysilicon layer, a small additional microcavity is arranged through which the sacrificial layer is removed during the process.

The document EP0451992 describes a microcomponent comprising a cavity arranged between a substrate and a cover suspended between two elements. A suspended beam is arranged inside the cavity. The cavity communicates with the outside by means of channels that are sealed by an oxide layer. The production method comprises an annealing step to obtain the required tension and deformation level of the beam.

OBJECT OF THE INVENTION

It is an object of the invention to remedy these shortcomings and, in particular, to achieve hermetic sealing of a microcavity while reducing the time required to produce the microcavity.

According to the invention, this object is achieved by the appended claims and in particular by the fact that the microcomponent comprises at least one mechanically stressed layer arranged above the first layer.

It is a further object of the invention to provide a method for production of a hermetically-sealed microcavity of a microcomponent according to the invention, successively comprising deposition of a sacrificial layer on a substrate, deposition of a first layer forming a cover, on the substrate and sacrificial layer, etching, in the first layer, of at least one hole opening out onto the sacrificial layer, removal of the sacrificial layer, via the hole, so as to create a microcavity, deposition of a second layer, so as to make the microcavity hermetic, method characterized in that it comprises, after etching of the hole and before removal of the sacrificial layer, deposition of an additional sacrificial layer covering the hole and a part of the first layer, over the periphery of the hole, deposition of a third layer on the first layer and the additional sacrificial layer, etching of at least one additional hole, in the third layer, offset with respect to the hole and opening out onto the additional sacrificial layer, removal of the sacrificial layer and of the additional sacrificial layer being performed through the additional hole so as to create the microcavity, and deposition of the second layer being performed on the third layer so as to seal the additional hole, the method comprising deposition of at least one mechanically tensile-stressed layer, after deposition of the first layer.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
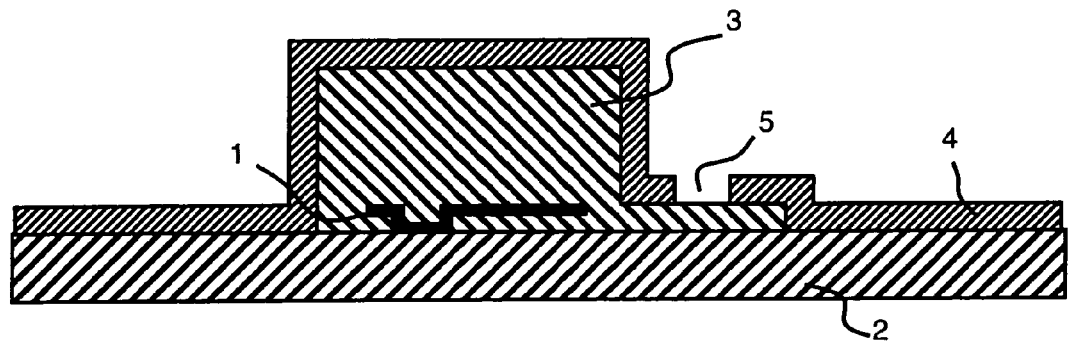
FIGS. 1 and 2 represent two steps of a method for production of a microcomponent according to the prior art.
Figure 2:
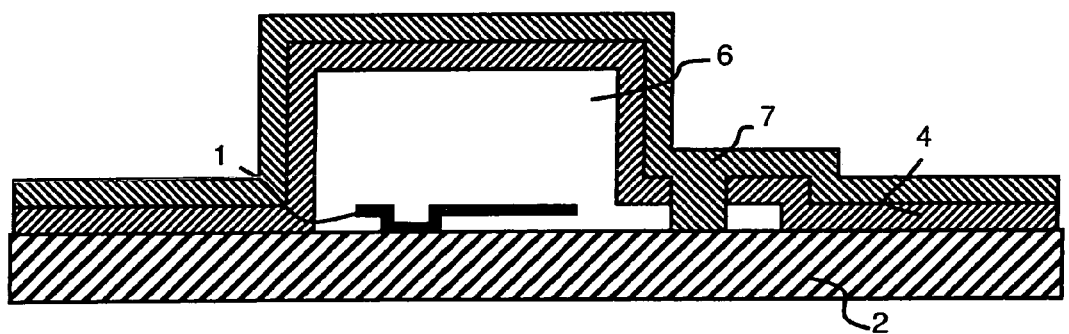
Figure 3:
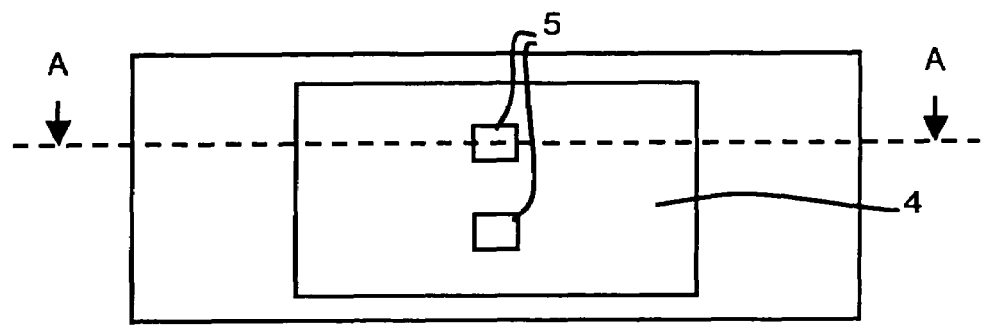
FIGS. 3, 5, and 7 represent, in top view, three successive steps of a particular embodiment of a method for production of a microcomponent according to the invention.
Figure 4:
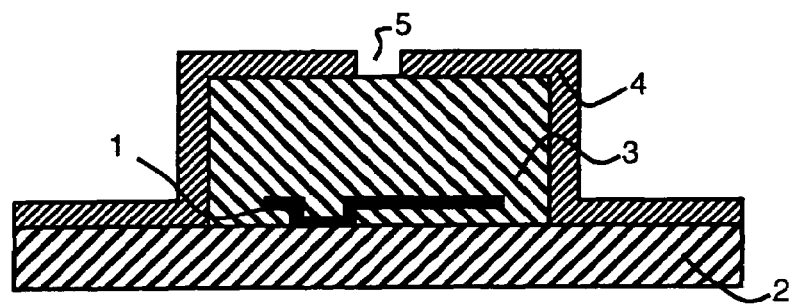
FIGS. 4, 6, and 8 represent the three steps represented in FIGS. 3, 5, and 7, in cross-section respectively along the lines A-A, B-B and C-C.

As represented in FIGS. 3 and 4, the holes 5 (two holes in the figures) etched in the first layer 4 and opening out onto a sacrificial layer 3 are preferably located at the highest part of the microcavity, i.e. at locations where the sacrificial layer 3 has a maximum thickness, for example about 8 to 10 microns. In this way, the duration of the subsequent removal step of the sacrificial layer 3, through the holes 5, is substantially reduced compared with the prior art.

Figure 5:
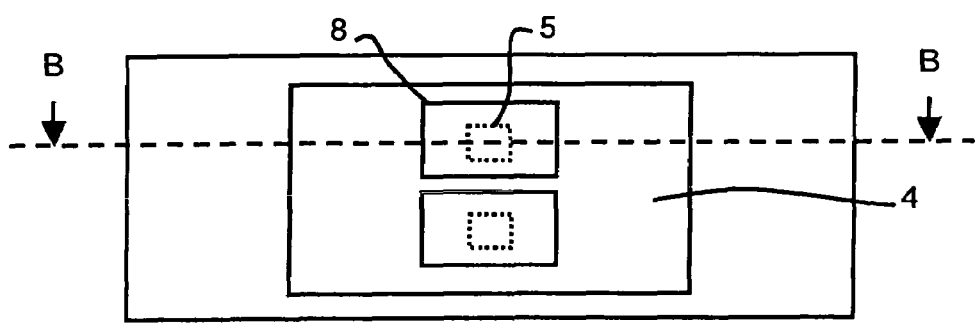
Figure 6:
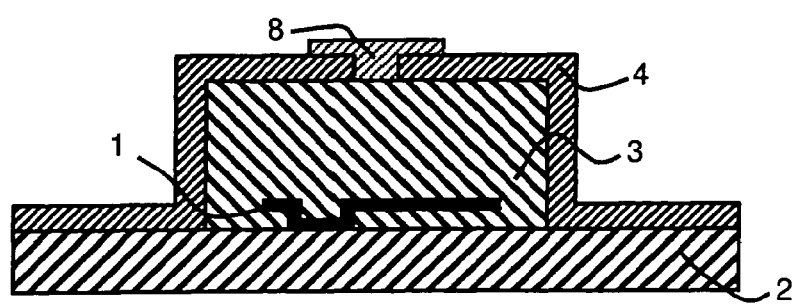
Figure 7:
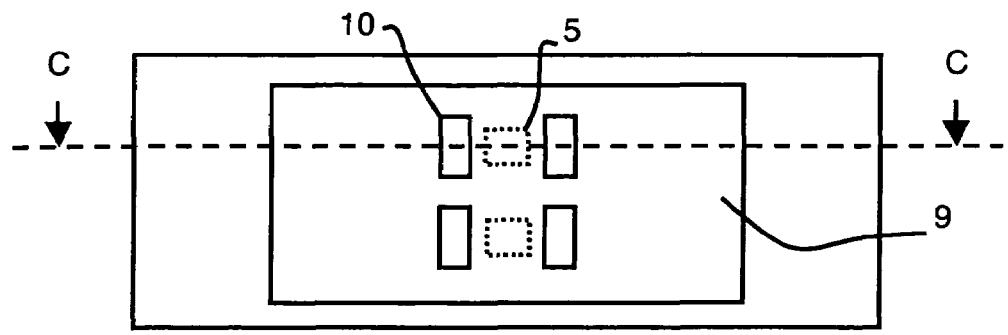
Figure 8:
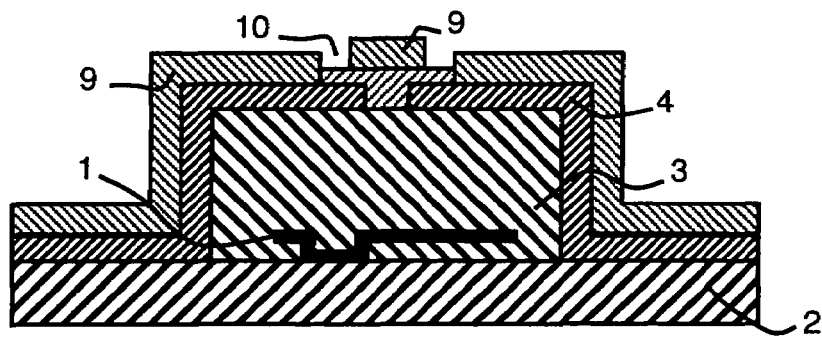
Figure 9:
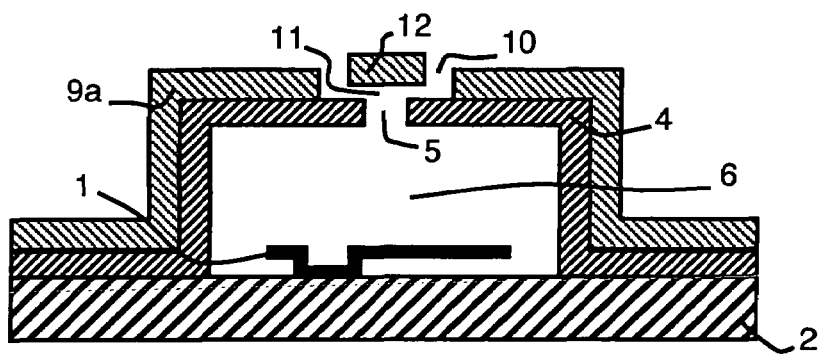
FIGS. 9 and 10 illustrate two subsequent steps of the method according to FIGS. 3 to 8.

In FIGS. 5 and 6, an additional sacrificial layer 8, designed to delineate an additional microcavity 11, is associated with each of the holes 5. The additional sacrificial layers 8 are deposited, after etching of the holes 5 and before removal of the sacrificial layer 3, so as to cover the holes 5 and a part of the first layer 4, over the periphery of the holes 5. The thickness of the additional sacrificial layers 8 is for example 0.3 microns. Then, as represented in FIGS. 7 and 8, a third layer 9 is deposited on the first layer 4 and on the additional sacrificial layers 8. Then at least one additional hole 10 (two in FIGS. 7 and 8) offset with respect to each hole 5 and opening out onto the corresponding additional sacrificial layer 8, is etched in the third layer 9. Then, as represented in FIG. 9, removal of the sacrificial layer 3 and of the additional sacrificial layers 8 is performed though the additional holes 10 so as to create the microcavity 6 and the additional microcavity 11, communicating with the corresponding hole 5 and with the corresponding additional holes 10 and arranged between the first layer 4 and the third layer 9.

Figure 10:
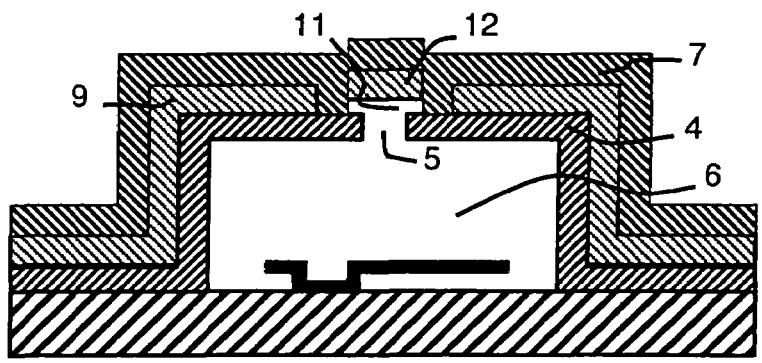

Then, as represented in FIG. 10, the second layer 7, or sealing layer, is deposited on the third layer 9, so as to seal the additional holes 10 and make the microcavity 6 hermetic.

Thus, the third layer 9 is arranged between the first layer 4 and the second layer 7 with an additional microcavity 11 between the first layer 4 and third layer 9. Since the additional holes 10 are offset with respect to the hole 5 and open out into the additional microcavity 11, of small thickness, sealing of the additional holes 10 by the second layer 7 is simplified, enabling hermetic tightness of the microcavity 6 to be achieved.

In FIGS. 7 to 10, two additional holes 10 are associated with each hole 5, so that a suspended bridge 12, formed in the third layer 9 and delineated by the two additional holes 10, covers the hole 5. The offset between the hole 5 and each additional hole 10 is such that no additional hole 10 covers the hole 5, even partially. In this way, the part of the second layer 7 sealing the holes 10 is supported by the first layer 4 and is thus prevented from depositing inside the microcavity 6.

The material of the sacrificial layers 3 and 8 can be a polymer, for example polyimide or a photoresist, enabling quick etching, for example dry etching. The sacrificial layers 3 and 8 can also be achieved by cathode sputtering so as to obtain, for example, a phosphosilicate glass (PSG) or a metal layer, for example a tungsten layer or a nickel layer. The first 4, second 7 and third 9 layers can be made of silicon dioxide ($SiO_2$), silicon nitride ($Si_3N_4$) or metal. The first layer 4 can for example be achieved by deposition of silicon dioxide having, for example, a thickness of 1.5 microns. The third layer 9 is preferably achieved by deposition of silicon nitride with a thickness of 1.5 microns for example. The second layer 7 is for example made of silicon nitride and has a thickness of 2 microns.

Figure 11:
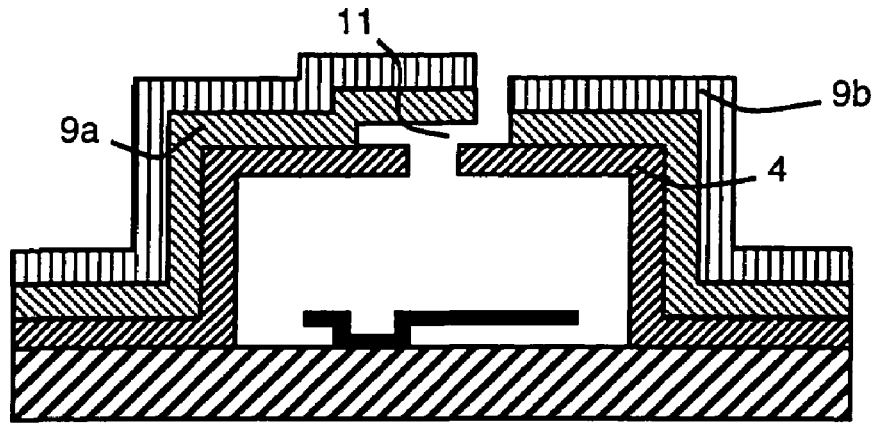
FIGS. 11 and 12 represent two steps, prior to deposition of the sealing layer, of another particular embodiment of a method for production according to the invention.
Figure 12:
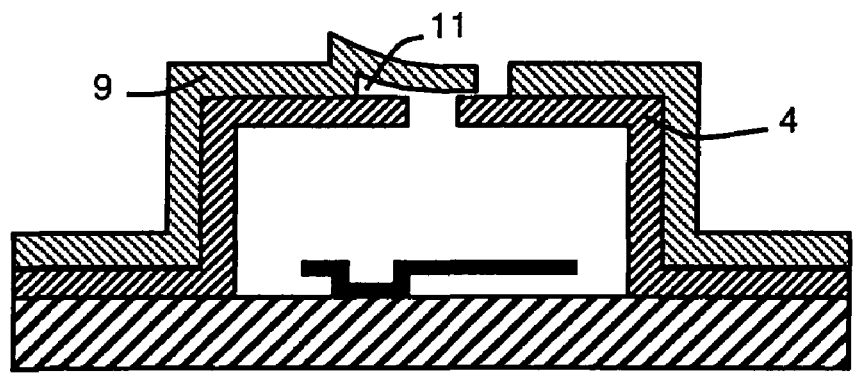

As represented in FIG. 11, the third layer 9 can be formed by a multilayer comprising at least two superposed sub-layers, initially deposited on the additional sacrificial layers 8 and on the first layer 4. In this case, a first sub-layer 9a, achieved under a tensile mechanical stress, is covered by a second sub-layer 9b achieved under a compressive mechanical stress. As the stresses of the first 9a and second 9b sub-layers are opposed, all of the first 9a and second 9b sub-layers keep their shape, after the sacrificial layers 3 and 8 have been removed. However, as represented in FIG. 12, once the second sub-layer 9b has been removed, the part of the third layer 9 released by removal of the corresponding additional sacrificial layer 8, i.e. covering the corresponding additional microcavity 11, automatically flexes in the direction of the first layer 4. Thus, the passage existing between the hole 5 and the additional hole 10 to enable the sacrificial layers 3 and 8 to be eliminated becomes narrower or even totally closed, and the space to be sealed is therefore reduced, which simplifies the sealing step. In this case, in the microcomponent obtained, the additional hole 10, adjacent to the additional microcavity 11, no longer communicates with this corresponding additional microcavity 11.

The third layer 9 can also be achieved, before removal of the sacrificial layers 3 and 8, by a single layer having a tensile mechanical stress. During removal of the corresponding additional sacrificial layer 8, the part of the third layer 9 thus released automatically flexes in the direction of the first layer 4, which may prolong the etching step of the sacrificial layer 3, but which, as previously, presents the advantage of simplifying sealing of a smaller space to be sealed, without requiring deposition of two sub-layers 9a and 9b.

Figure 13:
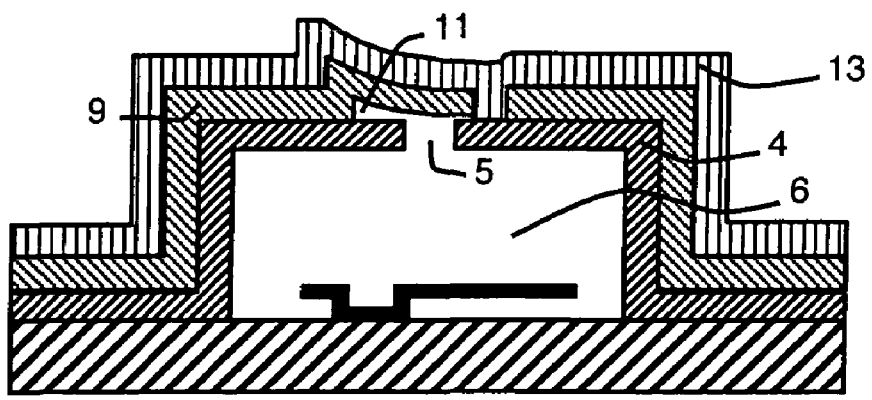
FIG. 13 represents a step, prior to deposition of the sealing layer, of another particular embodiment of a method for production of a microcomponent according to the invention.

In another embodiment represented in FIG. 13, the third layer 9 is achieved by a deposition that is either non-stressed or slightly compressive-stressed, which, in the latter case, makes for quicker removal of the sacrificial layers 3 and 8 by enlarging the passage between the additional holes 10 and the hole 5. Then, after the sacrificial layers 3 and 8 have been removed, a fourth layer 13 is made, on the third layer 9, with a tensile mechanical stress. The fourth layer 13 enters into the hole 10 and seals the hole 10. The third layer 9 and fourth layer 13 then flex in the direction of the first layer 4 as the layer 13 is deposited, which simplifies sealing of the additional holes 10.

The invention is not limited to the particular embodiments represented. In particular, the holes 5 can be of any number, as can the additional holes 10 associated with each hole 5 and opening out onto the corresponding additional sacrificial layer 8. A single additional sacrificial layer 8 can be associated with several holes 5 if required.

The invention claimed is:

1. A microcomponent comprising:
   a hermetically-sealed microcavity delineated by a cover comprising a first layer, in which at least one hole is formed, and a second layer making the microcavity hermetic,
   a third layer arranged between the first layer and the second layer,
   an additional microcavity, communicating with the at least one hole and being arranged between the first layer and the third layer, and at least one additional hole, adjacent to the additional microcavity, formed in the third layer, the at least one additional hole being offset with respect to the at least one hole and being sealed by the second layer,
   at least one mechanically tensile-stressed layer arranged above the first layer, the at least one mechanically tensile-stressed layer being different from the first layer and the second layer and, the at least one mechanically tensile-stressed layer being capable of flexing in a direction of the first layer and thereby reducing a space to be sealed by the second layer.

2. The microcomponent according to claim 1, wherein the additional microcavity communicates with the at least one additional hole.

3. The microcomponent according to claim 1, wherein the at least one hole is arranged on the highest part of the hermetically-sealed microcavity.

4. The microcomponent according to claim 1, wherein the offset between the at least one hole and the at least one additional hole is such that the at least one additional hole does not cover the at least one hole, even partially.

5. The microcomponent according to claim 1, wherein two additional holes are associated with each of the at least one hole so that a suspended bridge, formed in the third layer and delineated by the two additional holes, covers the at least one hole.

6. A method for production of a hermetically-sealed microcavity of a microcomponent, the method comprising:
   deposition of a sacrificial layer on a substrate,
   deposition of a first layer forming a cover, on the substrate and sacrificial layer,
   etching, in the first layer, of at least one hole that opens out onto the sacrificial layer,
   removal of the sacrificial layer, via the at least one hole, so as to create a microcavity,
   deposition of a second layer, so as to make the microcavity hermetic, after etching of the at least one hole and before removal of the sacrificial layer,
   deposition of an additional sacrificial layer covering the hole and a part of the first layer, over the periphery of the at least one hole,
   deposition of a third layer on the first layer and the additional sacrificial layer,
   etching of at least one additional hole, in the third layer, the at least one additional hole being offset with respect to the at least one hole that opens out onto the sacrificial layer, and opening out onto the additional sacrificial layer,
   removal of the sacrificial layer and removal of the additional sacrificial layer being performed through the at least one additional hole so as to create the microcavity, and
   deposition of the second layer being performed on the third layer so as to seal the at least one additional hole,
   deposition of at least one mechanically tensile-stressed layer, after deposition of the first layer, the at least one mechanically tensile-stressed layer being different from the first layer and the second layer and, the mechanically tensile-stressed layer being capable of flexing in the direction of the first layer and thereby reducing the space to be sealed by the second layer.

7. The method according to claim 6, wherein the third layer is mechanically tensile-stressed so that a part of the third layer released by removal of the additional sacrificial layer flexes in the direction of the first layer.

8. The method according to claim 6, wherein the third layer comprises a first mechanically tensile-stressed sub-layer covered by a second mechanically compressive-stressed sub-layer, the second mechanically compressive-stressed sub-layer being removed after the first sacrificial layer and the second sacrificial layer have been removed.

9. The method according to claim 6, wherein after the sacrificial layer and the additional sacrificial layer have been removed, a mechanically tensile-stressed fourth layer is deposited on the third layer, so that the third layer and the mechanically tensile-stressed fourth layer each flex in the direction of the first layer.

* * * * *